United States Patent
Minsek et al.

(10) Patent No.: US 7,994,108 B2
(45) Date of Patent: Aug. 9, 2011

(54) COMPOSITION USEFUL FOR REMOVAL OF POST-ETCH PHOTORESIST AND BOTTOM ANTI-REFLECTION COATINGS

(75) Inventors: David W. Minsek, New Milford, CT (US); Weihua Wang, Fremont, CA (US); David D. Bernhard, Kooskia, ID (US); Thomas H. Baum, New Fairfield, CT (US); Melissa K. Rath, Danbury, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 11/813,497

(22) PCT Filed: Jan. 9, 2006

(86) PCT No.: PCT/US2006/000366
§ 371 (c)(1),
(2), (4) Date: Sep. 16, 2008

(87) PCT Pub. No.: WO2006/074316
PCT Pub. Date: Jul. 13, 2006

(65) Prior Publication Data
US 2009/0215659 A1    Aug. 27, 2009

(51) Int. Cl.
*G03F 7/32* (2006.01)
(52) U.S. Cl. ......... 510/175; 430/329; 430/331; 510/178
(58) Field of Classification Search .............. 510/175, 510/178; 430/329, 331
See application file for complete search history.

(56) References Cited

U.S. PATENT DOCUMENTS

| | | | |
|---|---|---|---|
| 5,972,862 A | 10/1999 | Torii et al. | |
| 2001/0014534 A1* | 8/2001 | Aoki et al. | 438/689 |
| 2001/0021488 A1* | 9/2001 | Ichiki | 430/329 |
| 2002/0128164 A1* | 9/2002 | Hara et al. | 510/175 |
| 2002/0156148 A1* | 10/2002 | Arase et al. | 523/1 |
| 2003/0083214 A1* | 5/2003 | Kakizawa et al. | 510/175 |
| 2004/0180300 A1 | 9/2004 | Minsek et al. | |
| 2004/0224866 A1* | 11/2004 | Matsunaga et al. | 510/175 |
| 2005/0176603 A1* | 8/2005 | Hsu | 510/175 |
| 2005/0197265 A1* | 9/2005 | Rath et al. | 510/175 |

FOREIGN PATENT DOCUMENTS

JP      407247498       9/1995

* cited by examiner

*Primary Examiner* — Harold Y Pyon
*Assistant Examiner* — Timothy Chiang
(74) *Attorney, Agent, or Firm* — Tristan A. Fuierer; Rosa Yaghmour; Moore & Van Allen, PLLC

(57) ABSTRACT

An aqueous-based composition and process for removing hardened photoresist and/or bottom anti-reflective coating (BARC) material from a microelectronic device having same thereon. The aqueous-based composition includes at least one chaotropic solute, at least one alkaline base, and deionized water. The composition achieves high-efficiency removal of hardened photoresist and/or BARC material in the manufacture of integrated circuitry without adverse effect to metal species on the substrate, such as copper, and without damage to low-k dielectric materials employed in the microelectronic device architecture.

18 Claims, No Drawings

ID
COMPOSITION USEFUL FOR REMOVAL OF POST-ETCH PHOTORESIST AND BOTTOM ANTI-REFLECTION COATINGS

CROSS-REFERENCE TO RELATED APPLICATIONS

This application is filed under the provisions of 35 U.S.C. §371 and claims the priority of International Patent Application No. PCT/US2006/000366filed on 9 Jan. 2006, which claims priority to U.S. patent application Ser. No. 11/031,118filed on 7 Jan. 2005.

FIELD OF THE INVENTION

The present invention relates to aqueous-based compositions useful in microelectronic device manufacturing for the removal of hardened photoresist and/or bottom anti-reflection coatings (BARCs) from substrates having such layers thereon, and to methods of using such compositions for removal of hardened photoresist and/or BARC layers from microelectronic devices.

DESCRIPTION OF THE RELATED ART

Photolithography techniques comprise the steps of coating, exposure, and development. A wafer is coated with a positive or negative photoresist substance and subsequently covered with a mask that defines patterns to be retained or removed in subsequent processes. Following the proper positioning of the mask, the mask has directed therethrough a beam of monochromatic radiation, such as ultraviolet (UV) light or deep UV (DUV) light ($\lambda \approx 250$ nm), to make the exposed photoresist material more or less soluble in a selected rinsing solution. The soluble photoresist material is then removed, or "developed," thereby leaving behind a pattern identical to the mask.

Currently, there are four developed wavelengths of radiation used in the photolithographic industry —436 nm, 365 nm, 248 nm, and 193 nm —and recent efforts have focused on 157 nm lithography processes. In theory, with each wavelength decrease, smaller features can be created on the semiconductor chip. However, because the reflectively of the semiconductor substrate is inversely proportional to the photolithographic wavelength, interference and unevenly exposed photoresist has limited the consistency of the critical dimensions of the microelectronic device.

For example, upon exposure to DUV radiation, it is well known that the transmissivity of photoresist combined with the high reflectivity of the substrates to the DUV wavelengths results in the reflection of the DUV radiation back into the photoresist thereby producing standing waves in the photoresist layer. The standing waves trigger further photochemical reactions in the photoresist causing an uneven exposure of the photoresist, including in masked portions not intended to be exposed to the radiation, which results in variations in linewidths, spacing and other critical dimensions.

In order to address the transmissivity and reflectivity problems, bottom anti-reflective coatings (BARCs), both inorganic and organic in nature, have been developed which are applied to substrates prior to applying the photoresist. For example, organic BARCs, including, but not limited to, polysulfones, polyareas, polyurea sulfones, polyacrylates and poly(vinyl pyridine), are typically 600-1200 Å thick and deposited using spin-on coating techniques. Generally, organic BARCs are planarizing layers, filling up the vias evenly, and highly cross-linked. Organic BARCs prevent light reflection by matching the reflective index of the BARC layer with that of the photoresist layer while simultaneously absorbing radiation thereby preventing radiation reflection and standing waves.

During back-end-of-line (BEOL) dual-damascene processing of integrated circuits, gas-phase plasma etching is used to transfer the patterns of the developed photoresist coating to an underlying dielectric coating. During pattern transfer, the reactive plasma gases react with the developed photoresist, resulting in the formation of a hardened, crosslinked polymeric material, or "crust," on the surface of the photoresist. In addition, the reactive plasma gases react with the sidewalls of the BARC and the features etched into the dielectric. During front-end-of-line (FEOL) processing, ion implantation is used to add dopant atoms to the exposed wafer layers. Ion implant-exposed photoresist is also highly cross-linked similar to plasma etched photoresist.

The clean removal of hardened photoresist and/or BARC materials from the microelectronic device wafer has proven to be difficult and/or costly. If not removed, the layers may interfere with subsequent silicidation or contact formation. Typically, the layers are removed by oxidative or reductive plasma ashing or wet cleaning. However, plasma ashing, whereby the substrate is exposed to an oxidative or reductive plasma etch, may result in damage to the dielectric material, either by changing the feature shapes and dimensions, or by an increase in the dielectric constant of the dielectric material. The latter problem is more pronounced when low-k dielectric materials, such as organosilicate glasses (OSG) or carbon-doped oxide glasses, are the underlying dielectric material. As such, it is often desirable to avoid the use of plasma ashing to remove the hardened photoresist and/or BARC layers.

When a cleaner/etchant composition is used in BEOL applications to process surfaces having aluminum or copper interconnected wires, it is important that the composition possess good metal compatibility, e.g., a low etch rate on copper, aluminum, cobalt, etc. Aqueous removal solutions are preferred because of the simpler disposal techniques, however, the photoresist "crust" is typically extremely insoluble in aqueous cleaners, especially cleaners that do not damage the dielectric. Often substantial quantities of co-solvents, wetting agents and/or surfactants are added to the aqueous solutions to improve the cleaning ability of the solution.

For example, co-solvents may increase the ability to remove hardened photoresist by increasing the solubility of the photoresist material in the composition and/or decreasing the solution surface tension, i.e., increasing wettability, however, the inclusion of co-solvents may increase the undesirable corrosion of other materials such as metals and low-k dielectrics. Towards that end, a co-solvent-free aqueous solution is desirable, preferably one that completely and efficiently removes hardened photoresist and/or BARC layers from the underlying dielectric.

The present invention relates to removal compositions including chaotropic solutes. It is theorized that a chaotropic solute destructures or breaks-up the hydrogen-bonded structure of liquid water thus increasing the solubility of other species, e.g., polymers, in water. The effects of chaotropes were first noted by Hofmeister in 1888 (Hofmeister, F., *Arch. Exp. Pathol. Pharmakol.*, 24, 247-260 (1888)) as a function of protein solubility and a "series" of anions was developed based on protein solubilities in solutions containing those anions (Collins, K. D., Washabaugh, M. W., *Quart. Rev. Biophysics*, 18(4), 323-422 (1985)). Well known chaotropic anions include $Cl^-$, $NO_3^-$, $Br^-$, $I^-$, $ClO_4^-$, and $SCN^-$. Other chaotropic species include the guanidinium ion and nonionic urea, which have been demonstrated to increase the solubility of hydrocarbons in aqueous solutions (Wetlaufer, D. B., Malik, S. K., Stoller, L., Coffin, R. L., *J. Am. Chem. Soc.*, 86, 508-514 (1964)).

Recently, Xu et al. reported the swelling behaviors of poly (4-vinyl phenol) gel in chaotrope-containing solutions (Xu, L., Yokoyama, E., Watando, H., Okuda-Fukui, R., Kawauchi, S., Satoh, M., *Langmuir*, 20, 7064-7069 (2004)). Poly(4-vinyl phenol) is a highly cross-linked polymer which was demonstrated to be swollen in an aqueous tetraalkylammonium chloride solution, the swelling being demonstrative of increased solubility of the polymer in the chaotrope-containing solution. Similarly, hardened photoresist and BARC layers are highly cross-linked and thus, chaotropic solutes should theoretically swell the cross-linked photoresist and BARC layers in a similar manner.

It would therefore be a significant advance in the art to provide an aqueous-based, co-solvent-free composition that overcomes the deficiencies of the prior art relating to the removal of hardened photoresist and/or BARC layers from microelectronic devices.

Further, it would be a significant advance in the art to provide an aqueous based composition including a chaotropic solute to increase the solubility of the hardened photoresist and/or BARC layers in said composition to effectuate removal of the layers from the surface of a microelectronic device having same thereon.

SUMMARY OF THE INVENTION

The present invention relates to aqueous-based compositions useful in microelectronic device manufacturing for the removal of hardened photoresist and/or BARC layers from substrates having same thereon, and to methods of using such compositions for removal of hardened photoresist and/or BARC layers from microelectronic devices.

In one aspect, the invention relates to an aqueous-based removal composition useful for removing photoresist and/or bottom anti-reflective coating (BARC) materials from a microelectronic device substrate having such material(s) thereon, said composition comprising at least one chaotropic solute and at least one alkaline salt in an aqueous medium, wherein the removal composition is useful for removing photoresist and/or BARC materials from a microelectronic device having such materials thereon.

In another aspect, the invention relates to a method of removing photoresist and/or BARC material from a substrate having said material thereon, said method comprising contacting the substrate with an aqueous-based removal composition for sufficient time to at least partially remove said material from the substrate, wherein the aqueous-based removal composition comprises at least one chaotropic solute and at least one alkaline salt in an aqueous medium.

In another aspect, the present invention relates to a method of manufacturing a microelectronic device, said method comprising contacting the microelectronic device with an aqueous-based removal composition for sufficient time to at least partially remove photoresist and/or BARC material from the microelectronic device having said material thereon, wherein the aqueous-based removal composition includes at least one chaotropic solute, and at least one alkaline salt in an aqueous medium.

Yet another aspect of the invention relates to improved microelectronic devices, and products incorporating same, made using the methods of the invention comprising at least partial removal of photoresist and/or BARC layers from the microelectronic device having said material(s) thereon, using the methods and/or compositions described herein, and optionally, incorporating the microelectronic device into a product.

Other aspects, features and embodiments of the invention will be more fully apparent from the ensuing disclosure and appended claims.

DETAILED DESCRIPTION OF THE INVENTIONS AND PREFERRED EMBODIMENTS THEREOF

The present invention is based on the discovery of an aqueous-based composition that is highly efficacious for the removal of hardened photoresist and BARC layers from patterned microelectronic device wafers having same thereon. Specifically, the present invention relates to the removal of hardened photoresist and/or BARC layers from plasma etched and/or ion implanted microelectronic device wafers.

For ease of reference, "microelectronic device" corresponds to semiconductor substrates, flat panel displays, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly. Preferably, the microelectronic device is a semiconductor substrate.

"Hardened photoresist" as used herein includes, but is not limited to, photoresist that has been plasma etched, e.g., during BEOL dual-damascene processing of integrated circuits, and/or ion implanted, e.g., during front-end-of-line (FEOL) processing to implant dopant species in the appropriate layers of the microelectronic device wafer.

As used herein, "about" is intended to correspond to ±5% of the stated value.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.01 weight percent, based on the total weight of the composition in which such components are employed.

In one aspect, the present invention relates to aqueous-based removal compositions useful in removing hardened photoresist and/or BARC layers from a microelectronic device substrate. The formulation of the present invention comprises at least one chaotropic solute and at least one alkaline salt in an aqueous medium, present in the following ranges, based on the total weight of the composition:

| component of | % by weight |
| --- | --- |
| chaotropic solute(s) | about 1.0% to about 30.0% |
| alkaline salt(s) | about 1.0% to about 10.0% |
| aqueous medium | about 60.0% to about 98.0% |

In the broad practice of the invention, the aqueous-based removal composition may comprise, consist of, or consist essentially of at least one chaotropic solute and at least one alkaline salt in an aqueous medium. In general, the specific proportions and amounts of chaotropic solute(s), alkaline salt(s) and aqueous medium, in relation to each other, may be suitably varied to provide the desired removal action of the aqueous-based composition for the hardened photoresist and/or BARC layer species and/or processing equipment, as readily determinable within the skill of the art without undue effort.

As used herein, "aqueous medium" may be any aqueous-based medium which does not alter the removal efficacy of the at least one chaotropic solute and at least one alkaline salt. Preferably, the aqueous medium is water, most preferably deionized water.

The chaotropic solute serves to increase the solubility of the hardened photoresist and/or BARC constituent species in the aqueous-based composition. "Chaotropic solutes," as defined herein, refer to water soluble or aqueous alkaline soluble neutral and anionic species which increase the ability of an aqueous alkaline composition to remove hardened photoresist and/or BARC layers. "Chaotropic anions" preferably have an atomic or molecular radius of greater than or equal to 1.6 Å, for example those anions conventionally known to be chaotropic including, but not limited to, chloride, bromide, iodide, nitrate, thiocyanide and chlorate. Other solutes contemplated herein for use as chaotropic solutes include, but are not limited to: urea; and guanidinium salts, e.g., guanidinium chloride. Additionally, we expect certain solutes to act as chaotropes based on structural similarities to known chaotropes. Such solutes may include, but are not limited to: anionic benzoate salts and benzoate derivatives such as 2-, 3-, or 4-aminobenzoic acids, 2-, 3-, or 4-nitrobenzoic acid, 2-, 3-, or 4-anisic acid, 2-, 3-, or 4-fluoro-, chloro-, bromo-, or iodo-benzoic acid, 2-, 3-, or 4-methylthio-benzoic acid, and other mono- or poly-substituted benzoic acid salts; 2,4-diamino-6-methyl-1,3,5-triazine; aniline or substituted aniline such as 2-, 3-, or 4-methylthio-aniline or 2-, 3-, or 4-anisidine; 1,2-, 1,3-, or 1,4-phenylenediamine, nitrogen-containing heterocyclic compounds such as 1,3,5-triazine or substituted 1,3,5-triazines such as melamine, acetoguanamine, 2,4-diamino-6-phenyl-1,3,5-triazine, 2-chloro-4,6-diamino-1,3,5-triazine, 2,4,6-trimethoxy-1,3,5-triazine, 2,4,6-trimethoxy-1,3,5-triazine, 2,4-diamino-1,3,5-triazine, 2-amino-1,3,5-triazine, 2-amino-4-ethoxy-6-(methylamino)-1,3,5-triazine, 2-methoxy-4-methyl-6-(methylamino)-1,3,5-triazine; 1,2,4-triazole or substituted 1,2,4-triazoles; imidazole or substituted imidazoles such as 2-mercaptoimidazole, and 2-mercaptobenzimidazole.

Preferably, the cations associated with the chaotropic anions are metal-ion free, e.g., $(NR^1R^2R^3R^4)^+$ where $R^1$, $R^2$, $R^3$ and $R^4$ may be the same as or different from one another and each is independently selected from the group consisting of hydrogen and $C_1$-$C_6$ alkyl groups. Preferably, the cations associated with the chaotropic anion are tetramethylammonium, tetrabutylammonium, and benzyltrimethylammonium ions.

The alkaline salt(s) serve to attack the hardened photoresist and/or BARC layer. Although not wishing to be bound by theory, it is postulated that the chaotropic solute swells the polymeric layer allowing the alkaline salts to attack every interface of the hardened photoresist and/or BARC layer. Thus, the interface between the substrate and the hardened photoresist and/or BARC layer is compromised and the hardened photoresist and/or BARC layer delaminates from the substrate. Alkaline salt(s) contemplated herein include metal-ion free hydroxides, e.g., $(NR^1R^2R^3R^4)OH$ where $R^1$, $R^2$, $R^3$ and $R^4$ may be the same as or different from one another and each is independently selected from the group consisting of hydrogen and $C_1$-$C_6$ alkyl groups. Preferably, the alkaline salt is tetramethylammonium hydroxide and the pH of the aqueous-based removal composition is at least about 13.

In general, the specific proportions and amounts of chaotropic solute(s), alkaline salt(s), and deionized water in relation to each other may be suitably varied to provide the desired solubilizing action of the aqueous-based composition for the specific photoresist and/or BARC layers to be cleaned from the substrate. Such specific proportions and amounts are readily determinable by simple experiment within the skill of the art without undue effort.

The removal efficiency of the aqueous-based removal composition of the present invention may be enhanced by use of elevated temperature conditions in the contacting of the photoresist and/or BARC layers to be removed with the aqueous-based removal composition.

The aqueous-based removal compositions of the invention may optionally be formulated with additional components to further enhance the removal capability of the composition, or to otherwise improve the character of the composition. Accordingly, the composition may be formulated with surfactants, stabilizers, chelating agents, corrosion inhibitors, complexing agents, etc. Although the aqueous-based removal compositions of the invention normally contain no organic co-solvents, an organic co-solvent may be included so long as they do not corrode other materials such as metals and low-k dielectrics. Co-solvents contemplated herein include alkanols (e.g., straight chained or branched $C_1$-$C_6$ alcohols), butyl carbitol, methyl carbitol, sulfolane-w, sulfolane A, and propylene glycol.

Preferred aqueous-based removal compositions include formulations (A)-(J) enumerated hereinbelow:
Formulation A
2.5 wt. % tetramethylammonium hydroxide
20.0 wt. % urea
77.5 wt. % deionized water
Formulation B
1.5 wt. % tetramethylammonium hydroxide
1.6 wt. % 2,4-diamino-6-methyl-1,3,5-triazine
20.0 wt. % urea
76.9 wt. % deionized water
Formulation C
2.0 wt. % tetramethylammonium hydroxide
1.0 wt. % 2,4-diamino-6-methyl-1,3,5-triazine
1.0 wt. % 4-aminobenzoic acid
96.0 wt. % deionized water
Formulation D
2.0 wt. % tetramethylammonium hydroxide
2.4 wt. % tetramethylammonium nitrate
95.6 wt. % deionized water
Formulation E
5.0 wt. % tetramethylammonium hydroxide
9.0 wt. % tetramethylammonium nitrate
10.0 wt. % butyl carbitol
10.0 wt. % sulfolane-w
66.0 wt. % deionized water
Formulation F
from about 1.0 wt. % to about 5.0 wt. % tetramethylammonium hydroxide
from about 1.0 wt. % to about 20.0 wt % of 2-, 3-, or 4-nitrobenzoic acid tetramethylammonium salt
remainer deionized water
Formulation G
from about 1.0 wt. % to about 5.0 wt. % tetramethylammonium hydroxide
from about 1.0 wt. % to about 20.0 wt. % of ortho-, meta-, or para-phenylenediamine
remainer deionized water Formulation H
8.2 wt. % tetrabutylammonium hydroxide;
20.0 wt. % sulfolane A
30.0 wt. % methyl carbitol;
17.0 wt. % propylene glycol
2.0 wt. % 2,4-diamino-6-methyl-1,3,5-triazine
22.8 wt. % deionized water;
Formulation I
6.0 wt. % benzyltrimethylammonium hydroxide
10.0 wt. % sulfolane A
10.0 wt. % methyl carbitol;
20.0 wt. % propylene glycol
2.0 wt. % 2,4-diamino-6-methyl-1,3,5-triazine
52 wt. % deionized water; and
Formulation J
2.9 wt. % benzyltrimethylammonium hydroxide
0.025 wt. % potassium hydroxide
22.0 wt. % sulfolane A
27.0 wt. % methyl carbitol;
17.9 wt. % propylene glycol
1.5 wt. % urea
0.08% 2-mercaptobenzimidazole
28.595 wt. % deionized water.

In another embodiment of the present invention, the aqueous-based removal composition includes at least one chaotropic solute, at least one alkaline salt, and photoresist, in an aqueous medium. Preferably, the photoresist is hardened and dissolves in the aqueous-based removal composition. In a still further embodiment of the present invention, the aqueous-based removal composition includes at least one chaotropic solute, at least one alkaline salt, and BARC material, in an aqueous medium. Preferably, the hardened photoresist dissolves in the aqueous-based removal composition.

The aqueous-based compositions of the invention are easily formulated by simple addition of the respective ingredients and mixing to homogeneous condition. Furthermore, the removal compositions may be readily formulated as single-package formulations or multi-part formulations that are mixed at the point of use. The individual parts of the multi-part formulation may be mixed at the tool or in a storage tank upstream of the tool. The concentrations of the respective ingredients may be widely varied in specific multiples of the removal composition, i.e., more dilute or more concentrated, in the broad practice of the invention, and it will be appreciated that the removal compositions of the invention can variously and alternatively comprise, consist or consist essentially of any combination of ingredients consistent with the disclosure herein.

Accordingly, one embodiment of the invention relates to concentrated formulations of the compositions described herein without water, wherein the water may be added prior to use to form the removal composition of the invention.

Accordingly, another aspect of the invention relates to a kit including, in one or more containers, two or more components adapted to form the aqueous-based removal compositions of the invention. Preferably, the kit includes, in one or more containers, at least one chaotropic solute, at least one alkaline salt, and water. According to another embodiment, the kit includes at least one chaotropic solute, at least one alkaline salt, and water, for combining with the water at the fab.

In another aspect, the invention relates to methods of removal of hardened photoresist and/or BARC layers from a microelectronic device wafer surface using the aqueous-based removal compositions described herein, including Formulations (A)-(J).

In hardened photoresist and/or BARC removal application, the aqueous-based composition is applied in any suitable manner to the material to be cleaned, e.g., by spraying the aqueous-based composition on the surface of the material to be cleaned, by dipping (in a volume of the aqueous-based composition) of the material or article including the material to be cleaned, by contacting the material or article to be cleaned with another material, e.g., a pad, or fibrous sorbent applicator element, that is saturated with the aqueous-based composition, or by any other suitable means, manner or technique by which the aqueous-based composition is brought into removal contact with material to be cleaned.

Other methods of cleaning can be utilized for cleaning full wafers with a diameter of 200 or 300 mm such as typically used for microelectronic device circuit manufacturing, for example, single wafer or batch immersion, or single wafer or batch spray application.

As applied to microelectronic device manufacturing operations, the aqueous-based compositions of the present invention are usefully employed to remove hardened photoresist and/or BARC materials from substrates and microelectronic device structures on which such material(s) have been deposited.

The compositions of the present invention, by virtue of their selectivity for such hardened photoresist and/or BARC materials relative to other materials that may be present on the microelectronic device substrate, e.g., ILD structures, metallization, barrier layers, etc., achieve removal of the hardened photoresist and/or BARC material(s) in a highly efficient manner.

In use of the compositions of the invention for removing photoresist and/or BARC materials from microelectronic device substrates having same thereon, the aqueous-based composition typically is contacted with the substrate for a time of from about 1 minute to about 60 minutes, at temperature in a range of from about 40° C. to about 80° C. Such contacting times and temperatures are illustrative, and any other suitable time and temperature conditions may be employed that are efficacious to completely remove the hardened photoresist and/or BARC material from the substrate using the aqueous-based compositions of the present invention, within the broad practice of the invention.

Following the achievement of the desired removal action, the aqueous-based composition is readily removed from the substrate or article to which it has previously been applied, e.g., by rinse, wash, or other removal step(s), as may be desired and efficacious in a given end use application of the compositions of the present invention. Preferably, the substrate or article is rinsed with copious amounts of deionized water and blown dry with nitrogen gas prior to subsequent processing.

In another aspect, the present invention relates to a method of manufacturing a microelectronic device, said method comprising contacting the microelectronic device with an aqueous-based removal composition for sufficient time to at least partially remove photoresist and/or BARC material from the microelectronic device having said material thereon, wherein the aqueous-based removal composition includes at least one chaotropic solute, and at least one alkaline salt in an aqueous medium. Preferably, the photoresist is hardened.

Yet another aspect of the invention relates to improved microelectronic devices, and products incorporating same, made using the methods of the invention comprising at least partial removal of photoresist and/or BARC layers from the microelectronic device having said material(s) thereon, using the methods and/or compositions described herein, and optionally, incorporating the microelectronic device into a product. Preferably, the photoresist is hardened.

The features and advantages of the invention are more fully shown by the illustrative examples discussed below.

Example 1

Cleaning was performed on samples of patterned semiconductor substrate consisting of layers of hardened photoresist, BARC, low-k dielectric (specifically carbon-doped oxide), and silicon nitride. Plasma etching had been previously performed to transfer a pattern of lines, spaces, and holes of varying dimensions, from about 100 nanometers to greater than 10 microns, from a pattern formed in a top coating of photoresist to the underlying materials. The pattern consisted of spaces etched into the substrate, stopping at the silicon nitride etch-stop layer. The hardened photoresist and BARC was present as a coating of between 10 to 50 nanometers.

A section of the substrate was cleaned by immersion for a fixed time at a fixed temperature in a static bath of the Formulation A cleaning solution described hereinabove. After immersion for the set time the sample was removed, rinsed with copious amounts of de-ionized water, and blown dry with nitrogen. A cleaning time of 30 minutes at 55° C. was sufficient to remove 100% of the hardened photoresist and BARC. Cleaning was observed by top-down optical microscopy and confirmed by scanning electron microscopy (SEM).

Example 2

Cleaning using Formulation B was performed on a sample of patterned semiconductor substrate such as that described in Example 1 using the same method described in Example 1. An immersion time of greater than 20 minutes but less than 30 minutes at 55° C. was sufficient to clean 100% of the hardened photoresist and BARC material from the substrate as observed by top-down optical microscopy and confirmed by scanning electron microscopy (SEM).

Example 3

Cleaning using Formulation C was performed on a sample of patterned semiconductor substrate such as that described in Example 1 using the same method described in Example 1. An immersion time of greater than 20 minutes but less than 30 minutes at 55° C. was sufficient to clean close to 100% of the hardened photoresist and BARC material from the substrate as observed by top-down optical microscopy and confirmed by scanning electron microscopy (SEM).

Example 4

Cleaning using Formulation D was performed on a sample of patterned semiconductor substrate such as that described in Example 1 using the same method described in Example 1. An immersion time of greater than 20 minutes but less than 30 minutes at 55° C. was sufficient to clean about 90% of the photoresist and BARC material from the substrate as observed by top-down optical microscopy and confirmed by scanning electron microscopy (SEM).

Example 5

Cleaning using Formulation E was performed on a sample of patterned semiconductor substrate such as that described in Example 1 using the same method described in Example 1. An immersion time of about 20 minutes at 55° C. was sufficient to clean 100% of the photoresist and BARC material from the substrate as observed by top-down optical microscopy and confirmed by scanning electron microscopy (SEM).

Accordingly, while the invention has been described herein in reference to specific aspects, features and illustrative embodiments of the invention, it will be appreciated that the utility of the invention is not thus limited, but rather extends to and encompasses numerous other aspects, features and embodiments. Accordingly, the claims hereafter set forth are intended to be correspondingly broadly construed, as including all such aspects, features and embodiments, within their spirit and scope.

What is claimed is:

1. An aqueous-based removal composition for the removal of photoresist and/or bottom anti reflective coating (BARC) materials from a microelectronic device, said composition comprising at least one chaotropic solute, urea, and at least one alkaline salt in an aqueous medium, wherein the at least one chaotropic solute comprises a chaotropic species selected from the group consisting of: guanidinium salts; 2-, 3-, and 4-nitrobenzoic acid; 2-, 3-, and 4-anisic acid; 2-, 3-, and 4-fluoro-, chloro-, bromo-, and iodo-benzoic acid; 2-, 3-, and 4-methylthio -benzoic acid; 2-, 3-, and 4-methylthio-aniline; 2-, 3-, and 4-anisidine; melamine; 2,4-diamino-6-phenyl-1, 3,5-triazine; 2- chloro-4,6-diamino-1,3,5-triazine; 2,4,6-trimethoxy-1,3,5-triazine; 2,4-diamino-1,3,5-triazine; 2-amino-1,3,5-triazine; 2-amino-4-ethoxy-6-(methylamino)-1,3,5-triazine; 2-methoxy-4-methyl-6-(methylamino)-1,3,5-triazine; 2-mercaptobenzimidazole; and combinations thereof, wherein the at least one alkaline salt comprises $(NR^1R^2R^3R^4)OH$, wherein $R^1$, $R^2$, $R^3$ and $R^4$ are the same as or different from one another and each is independently selected from the group consisting of hydrogen, $C_1$-$C_6$ alkyl groups, and benzyl groups.

2. The composition of claim 1, wherein both the at least one chaotropic solute and the at least one alkaline salt are metal-ion free.

3. The composition of claim 1, further comprising 2-, 3-, and 4-aminobenzoic acid; 1,2,4-triazole; 2-mercaptoimidazole; and 2,4-diamino-6-methyl-1,3,5-triazine.

4. The composition of claim 1, further comprising photoresist and/or BARC material.

5. The composition of claim 1, further comprising co-solvent, wherein the co-solvent is selected from the group consisting of straight-chained $C_1$-$C_6$ alcohols, branched $C_1$-$C_6$alcohols, diethylene glycol butyl ether, diethylene glycol methyl ether, sulfolane-w, sulfolane -A, and propylene glycol.

6. The composition of claim 1, wherein the at least one alkaline salt comprises benzyltrimethylammonium hydroxide.

7. The composition of claim 1, having a pH greater than about 13.

8. The composition of claim 1, comprising:
2.9 wt. % benzyltrimethylammonium hydroxide
0.025 wt. % potassium hydroxide
22.0 wt. % sulfolane A
27.0 wt. % methyl carbitol;
17. 9 wt. % propylene glycol
1.5 wt. % urea
0.08 wt. % 2-mercaptobenzimidazole
28.595 wt. % deionized water.

9. A method of removing photoresist and/or BARC material from a substrate having said material thereon, said method comprising contacting the substrate with an aqueous-based removal composition to at least partially remove said material from the substrate, wherein the aqueous-based removal composition comprises at least one chaotropic solute, urea and at least one alkaline salt in an aqueous medium, wherein the at least one chaotropic solute comprises a chaotropic species selected from the group consisting of: guanidinium salts; 2-, 3-, and 4-nitrobenzoic acid; 2-, 3-, and 4-anisic acid; 2-, 3-, and 4-fluoro-, chloro-, bromo-, and iodo-benzoic acid; 2-, 3-, and 4-methylthio-benzoic acid; 2-, 3-, and 4-methylthio-aniline; 2-, 3-, and 4-anisidine; melamine; 2,4-diamino-6-phenyl-1,3,5-triazine; 2-chloro-4,6-diamino-1,3,5-triazine; 2,4,6-trimethoxy-1,3,5-triazine; 2,4-diamino-1,3,5-triazine; 2-amino-1,3,5-triazine; 2-amino-4-ethoxy-6-(methylamino)-1,3,5-triazine; 2-methoxy-4-methyl-6-(methylamino)-1,3,5-triazine; 2-mercaptobenzimidazole; and combinations thereof, wherein the at least one alkaline salt comprises $(NR^1R^2R^3R^4)OH$, wherein $R^1$, $R^2$, $R^3$ and $R^4$ are the same as or different from one another and each is independently selected from the group consisting of hydrogen, $C_1$-$C_6$ alkyl groups, and benzyl groups.

10. The method of claim 9, wherein the substrate comprises a microelectronic device structure, and wherein the material comprises a layer selected from the group consisting of: photoresist hardened by plasma etching; photoresist hardened by ion implantation; and BARC.

11. The method of claim 9, wherein said contacting is selected from the group consisting of: time of from about 1 minute to about 60 minutes; temperature in a range of from about 40° C. to about 80° C.; and combinations thereof.

12. The method of claim 9, wherein both the at least one chaotropic solute and the at least one alkaline salt are metal-ion free.

13. The composition of claim 1, wherein the at least one chaotropic solute comprises 2-mercaptobenzimidazole.

14. The method of claim 9, wherein the aqueous-based removal composition comprises:
2.9 wt. % benzyltrimethylammonium hydroxide
0.025 wt. % potassium hydroxide
22.0 wt. % sulfolane A
27.0 wt. % methyl carbitol;
17.9 wt. % propylene glycol
1.5 wt. % urea
0.08 % 2-mercaptobenzimidazole
28.595 wt. % deionized water.

15. The method of claim 9, further comprising rinsing the substrate with deionized water following contact with the aqueous-based removal composition.

16. A method of making a microelectronic device, said method comprising removing photoresist and/or BARC layers from a microelectronic device having said material(s) thereon using the aqueous-based removal composition of claim 1.

17. A kit comprising, in one or more containers, reagents for forming an aqueous-based removal composition, wherein said removal composition comprises at least one chaotropic solute, urea and at least one alkaline salt in an aqueous medium, wherein the at least one chaotropic solute comprises a chaotropic species selected from the group consisting of: guanidinium salts; 2-, 3-, and 4-nitrobenzoic acid; 2-, 3-, and 4- anisic acid; 2-, 3-, and 4-fluoro-, chloro-, bromo-, and iodo-benzoic acid; 2-, 3-, and 4-methylthio-benzoic acid; 2-, 3and 4-methylthio-aniline; 2-, 3-, and 4-anisidine; melamine; 2,4-diamino-6-phenyl-1,3,5-triazine; 2-chloro-4,6-diamino-1,3,5-triazine; 2,4,6-trimethoxy-1,3,5-triazine; 2,4-diamino-1,3,5-triazine; 2-amino-1,3,5-triazine; 2-amino-4-ethoxy-6-(methylamino)-1,3,5-triazine; 2-methoxy-4-methyl-6-(methylamino)-1,3,5-triazine; 2-mercaptobenzimidazole; and combinations thereof, wherein the at least one alkaline salt comprises $(NR^1R^2R^3R^4)OH$, wherein $R^1$, $R^2$, $R^3$ and $R^4$ are the same as or different from one another and each is independently selected from the group consisting of hydrogen, $C_1$-$C_6$ alkyl groups, and benzyl groups, and wherein the kit is adapted to form an aqueous-based removal composition suitable for removing material photoresist and/or BARC material from a substrate having said material thereon.

18. The composition of claim 1, wherein the at least one alkaline salt comprises benzyltrimethylammonium hydroxide and the at least one chaotropic solute comprises 2-mercaptobenzimidazole.

* * * * *